US009355805B2

(12) United States Patent
Nishito

(10) Patent No.: US 9,355,805 B2
(45) Date of Patent: May 31, 2016

(54) INPUT DEVICE

(71) Applicant: Honda Motor Co., Ltd., Tokyo (JP)

(72) Inventor: Kazunobu Nishito, Wako (JP)

(73) Assignee: HONDA MOTOR CO., LTD., Tokyo (JP)

( * ) Notice: Subject to any disclaimer, the term of this patent is extended or adjusted under 35 U.S.C. 154(b) by 0 days.

(21) Appl. No.: 14/454,099

(22) Filed: Aug. 7, 2014

(65) Prior Publication Data

US 2015/0041300 A1     Feb. 12, 2015

(30) Foreign Application Priority Data

Aug. 9, 2013   (JP) ................................. 2013-166036

(51) Int. Cl.
| | |
|---|---|
| *G06F 3/0354* | (2013.01) |
| *H01H 89/00* | (2006.01) |
| *H01H 9/54* | (2006.01) |
| *H01H 13/02* | (2006.01) |
| *H03K 17/96* | (2006.01) |
| *B60K 37/06* | (2006.01) |
| *H01H 25/04* | (2006.01) |

(52) U.S. Cl.
CPC ................ *H01H 89/00* (2013.01); *B60K 37/06* (2013.01); *G06F 3/03547* (2013.01); *H01H 9/54* (2013.01); *H01H 13/023* (2013.01); *H03K 17/962* (2013.01); *H03K 17/9622* (2013.01); *B60K 2350/1024* (2013.01); *B60K 2350/1052* (2013.01); *B60K 2350/901* (2013.01); *B60K 2350/928* (2013.01); *G06F 2203/04105* (2013.01); *H01H 25/041* (2013.01); *H01H 2013/026* (2013.01); *H01H 2231/026* (2013.01); *H01H 2231/032* (2013.01); *H01H 2239/006* (2013.01); *H01H 2239/074* (2013.01); *H03K 2217/960705* (2013.01)

(58) Field of Classification Search
None
See application file for complete search history.

(56) References Cited

U.S. PATENT DOCUMENTS

| | | | |
|---|---|---|---|
| 8,076,949 B1 * | 12/2011 | Best ........................ | G06F 3/044 324/663 |
| 8,487,912 B1 | 7/2013 | Peterson | |
| 2003/0107557 A1 | 6/2003 | Liebenow et al. | |

(Continued)

FOREIGN PATENT DOCUMENTS

| | | |
|---|---|---|
| EP | 2090965 A1 | 8/2009 |
| JP | 2009-265871 | 11/2009 |

(Continued)

OTHER PUBLICATIONS

European Search Report dated Dec. 3, 2014, 8 pages.

(Continued)

*Primary Examiner* — Dwayne Bost
*Assistant Examiner* — Christopher Kohlman
(74) *Attorney, Agent, or Firm* — Rankin, Hill & Clark LLP

(57) ABSTRACT

An input device having a touch sensor installed on a push switch includes a first detection unit for detecting a first predetermined operation on the push switch, a second detection unit for detecting a second predetermined operation on the touch sensor, and a control unit for invalidating the second predetermined operation when the second predetermined operation is detected by the second detection unit within a predetermined time after detection of the first predetermined operation by the first detection unit. For example, the device is disposed on a spoke unit that is operable by a driver's thumb while the driver grips a steering wheel.

7 Claims, 8 Drawing Sheets

(56) References Cited

U.S. PATENT DOCUMENTS

| | | | | |
|---|---|---|---|---|
| 2004/0224768 | A1* | 11/2004 | Hussaini | A63F 13/06 463/37 |
| 2007/0236472 | A1* | 10/2007 | Bentsen | G06F 3/03547 345/173 |
| 2012/0075196 | A1* | 3/2012 | Ashbrook | G06F 3/014 345/173 |
| 2012/0212437 | A1* | 8/2012 | Kobayashi | G06F 1/1624 345/173 |
| 2012/0249473 | A1 | 10/2012 | Suzuki | |

FOREIGN PATENT DOCUMENTS

| | | |
|---|---|---|
| JP | 2009-298285 | 12/2009 |
| JP | 2011-100486 | 5/2011 |

OTHER PUBLICATIONS

Japanese Office Action with partial English Translation dated Jul. 21, 2015, 7 pages.

* cited by examiner

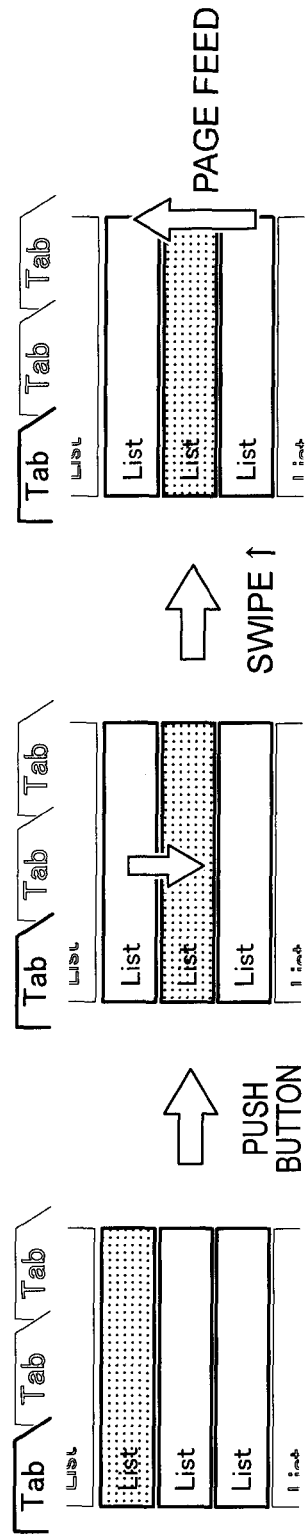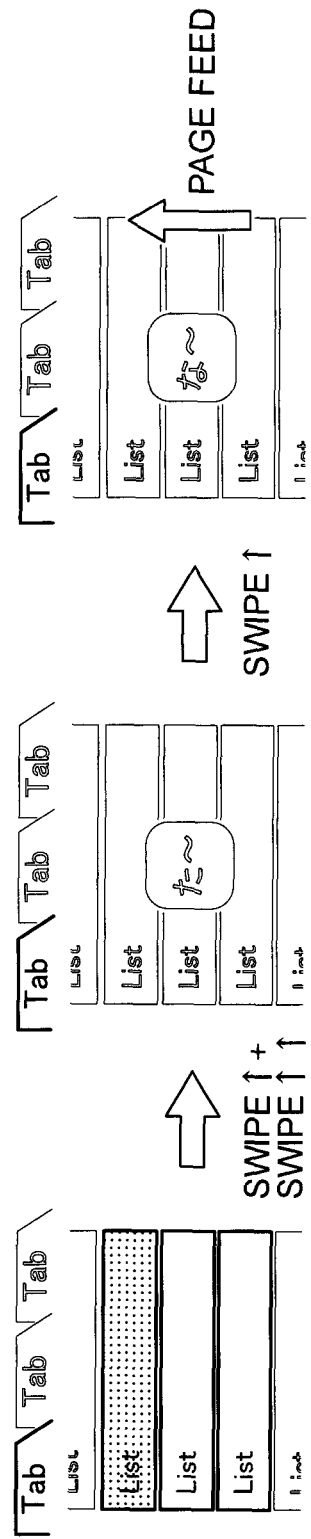

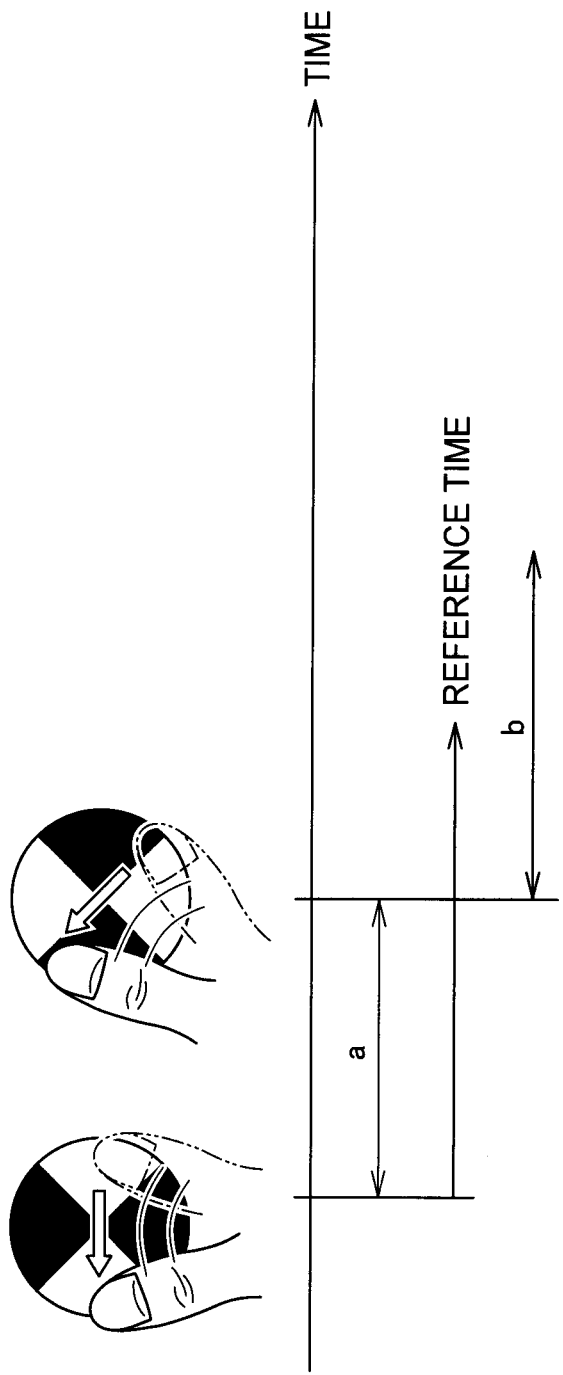

INPUT DEVICE

FIELD OF THE INVENTION

The present invention relates to an improved input device usable as a remote control for a car navigation device on board a vehicle.

BACKGROUND OF THE INVENTION

A conventional steering switch is based on a push operation, and is commonly operated by moving a finger to a button position and pushing in. Lately there has appeared a steering switch of a type in which a touch sensor is installed in a spoke unit of a handle, and direct sensory input is possible by swiping or performing another gesture on the sensor surface.

For example, Japanese Patent Application Laid-Open Publication No. 2009-298285 discloses technology related to an input device that allows input of a large amount of information while an operator grips the steering wheel of a vehicle. In this technology, an input operation is selected on the basis of a combination of gestures detected from a plurality of touch pads disposed on the steering wheel, and a car navigation device can be controlled on the basis of the selected operation. For example, an image displayed on a display unit is enlarged or reduced by performing gestures at the same time and in the same direction on the touch pad.

In the technology disclosed in Japanese Patent Application Laid-Open Publication No. 2009-298285, because an input operation is selected by a combination of gestures detected from two touch pads (touch sensors), the operator can input many kinds of information while gripping the steering wheel of the vehicle. However, the driver, being the operator, must simultaneously operate a right touch sensor with the right thumb and a left touch sensor with the left thumb while gripping the steering wheel, and accordingly the operation is a nuisance. Also, depending on the application, input using a push switch rather than a touch sensor may be effective, and accordingly there has been a desire for an input device having favorable usability.

SUMMARY OF THE INVENTION

The present invention was conceived in order to solve the above problem, and an object thereof is to provide an input device having improved usability.

In order to solve the above problem, the present invention provides an input device which comprises a touch sensor installed on a push switch, a first detection unit for detecting a first predetermined operation on the push switch, a second detection unit for detecting a second predetermined operation on the touch sensor, and a control unit for recognizing the first predetermined operation from the first detection unit and the second predetermined operation from the second detection unit. The control unit does not recognize the second predetermined operation when the second predetermined operation is detected by the second detection unit within a predetermined time after the first predetermined operation is detected by the first detection unit.

An input device having improved usability can be provided by configuring as above.

It is preferred that a plurality of the push switches be provided and the touch sensor is installed on the plurality of push switches.

Preferably, the input device further comprises a notification unit for notifying the operator that the second predetermined operation is invalid.

In a preferred form, the control unit recognizes the second predetermined operation as valid when a third predetermined operation is detected by the second detection unit within a second predetermined time before the first predetermined operation is detected by the first detection unit.

Desirably, the second predetermined operation is a swipe while a touch surface of the detection unit is divided into four regions, upper, lower, left, and right. The control unit may be arranged to recognize any of a swipe in a first direction going from the lower region to the upper region, a swipe in a second direction going from the upper region to the lower region, a swipe in a third direction going from the left region to the right region, and a swipe in a fourth direction going from the right region to the left region.

The first detection unit and the second detection unit may be disposed on a spoke unit that is operable by a driver's thumb while the driver grips a steering wheel.

In a desired form, the notification unit has a light source installed in each region among the upper region, the lower region, the left region, and the right region inside the touch surface, and turns off illumination of the light sources corresponding to the regions other than the region in which the first predetermined operation was performed while the second predetermined operation is invalid.

In another desired form, the notification unit has a light source installed inside the touch surface, and changes a color of illumination of the light source while the second predetermined operation is invalid.

BRIEF DESCRIPTION OF THE DRAWINGS

A preferred embodiment of the present invention will be described in detail below with reference to the accompanying drawings, in which:

FIGS. 6A and 6B are views illustrating examples of screen transitions when the input device of the embodiment of the present invention is applied to a media player;

FIG. 8 is a view illustrating an example of processing of variable setting of reference time in FIG. 4.

DETAILED DESCRIPTION OF THE PREFERRED EMBODIMENTS

An input device according to an embodiment of the present invention is described in detail below with reference to the accompanying drawings.

Figure 1:
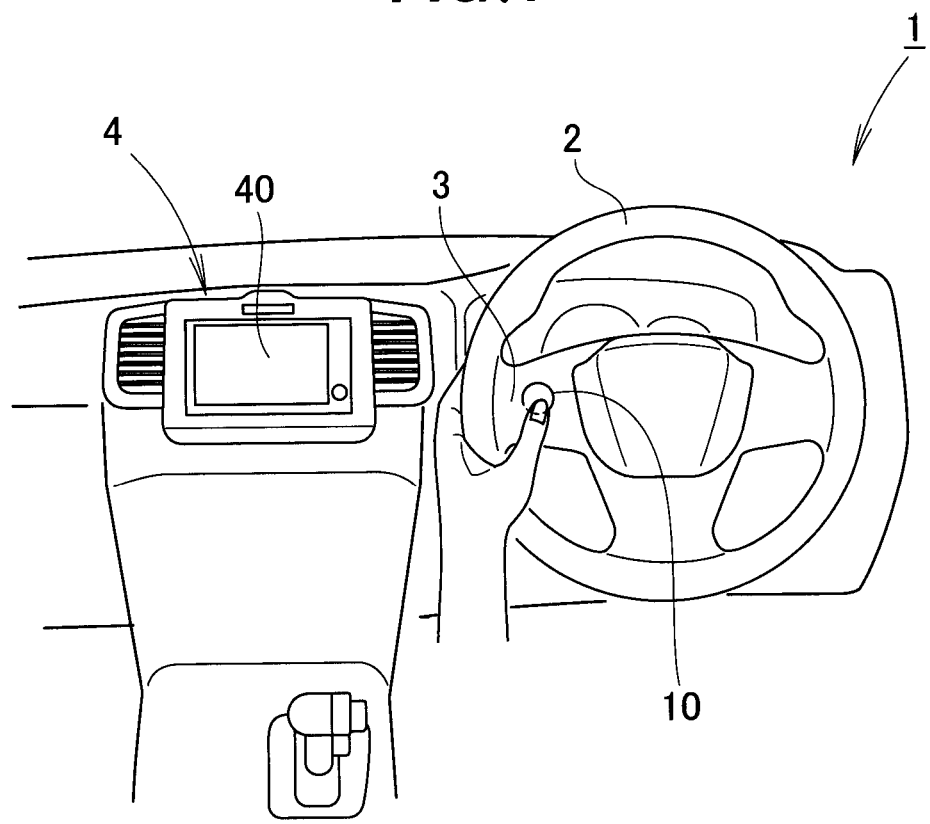
FIG. 1 is an external view of the surroundings of a vehicular instrument panel on which is installed an input device according to an embodiment of the present invention.

As illustrated in FIG. 1, the input device 10 of the present embodiment is used, for example, as a remote control for a car navigation device 4 on board a vehicle 1, and is disposed on a spoke unit 3 that is operable by a driver's thumb while the driver grips a steering wheel 2.

An instruction from operation of the input device 10 by the driver is taken in by the car navigation device 4, and display information generated in accordance with applications executed by the car navigation device 4 is displayed on a display unit 40. "Applications" mentioned here include a navigation application for providing destination search and directions and guidance, as well as a media player for playing music or movies, a display on a meter, SNS (Social Networking Service), email, and the like.

Figure 2:
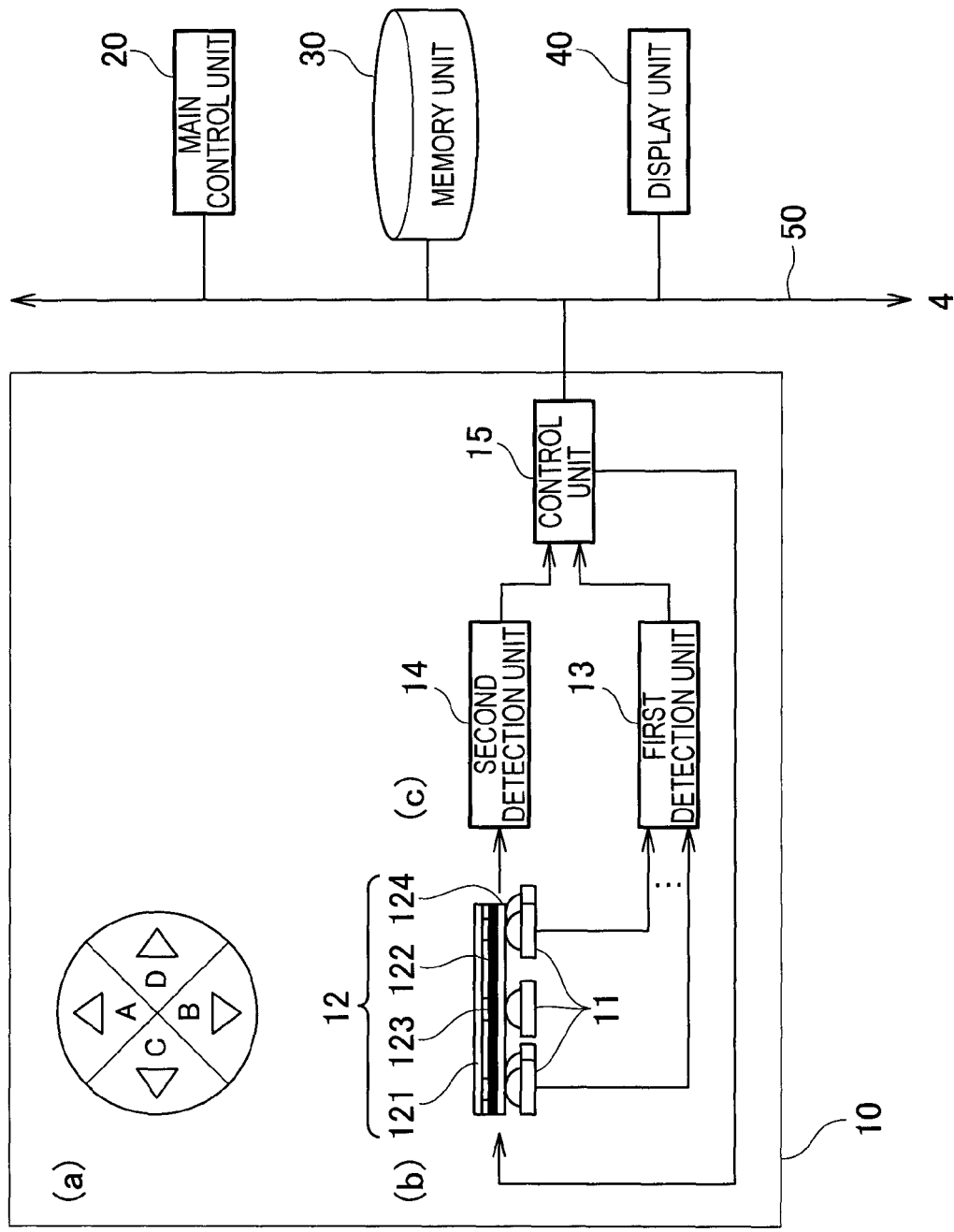
FIG. 2 is a structural diagram of the input device of the embodiment of the present invention and an internal configuration diagram of an electrical system of a car navigation device including the input device.

FIG. 2 illustrates the structure of the input device 10, as well as the internal configuration of an electrical system of the car navigation device 4 including the input device 10.

As illustrated in FIG. 2(a), the external appearance of the input device 10 is circular in planar shape of the input device 10. As illustrated in FIG. 2(b), the input device 10 has a layer structure in sectional shape of the input device 10, in which a touch sensor 12 is installed on top of five push switches 11.

The push switches 11 include a total of five push switches corresponding to an enter key and four direction keys, for up, down, left, and right, respectively. The touch sensor 12 is an electrostatic capacitance sensor having an integrated structure in which a dielectric layer 122 and a light source 123 serving as a notification unit are sandwiched by a transparent electrode sheet 121 serving as a touch surface and a transparent electrode sheet 124 facing opposite the transparent electrode sheet 121. In the touch sensor 12, electrostatic capacitance between the transparent electrode sheets 121 and 124 changes and the operation on the touch surface (transparent electrode sheet 121) is detected when a thumb of the driver, being the operator, contacts the transparent electrode sheet 121, being the touch surface.

As illustrated in FIG. 2(a), the touch surface of the touch sensor 12 is divided into four recognition regions; an upper region A, a lower region B, a left region C, and a right region D, so that a gesture including a swipe can be detected by detecting which of the fourfold-divided recognition regions have been touched by the driver's thumb. For example, there can be detected any of a downward swipe going from the upper region A of the touch surface to the lower region B, an upward swipe going from the lower region B to the upper region A, a rightward swipe going from the left region C to the right region D, and a leftward swipe going from the right region D to the left region C. "Swipe" mentioned here is a general term for an operation of "tracing," "shifting," "sweeping," "snapping," or "wiping" while touching the touch surface 121 with a thumb, and implies a gesture involving a direction of operation.

For example, the light source 123 is a LED (Light Emitted Diode) installed in each of the four recognition regions divided into the upper, lower, left, and right regions, and is always on after the power is turned on. Under control of a control unit 15, the illumination of the light source 123 is turned off in the regions of the touch panel 12 other than the recognition region corresponding to the installation position of the pushed-down push switch 11, or the color of the illumination in all regions is changed, while input using the touch sensor 12 is invalid.

As illustrated in FIG. 2(c), the input device 10 of the present embodiment is also configured with a first detection unit 13, a second detection unit 14, and the control unit 15. The first detection unit 13 scans the ON/OFF conditions of the push switches 11 (first predetermined operation) and outputs the obtained information to the control unit 15. The second detection unit 14 detects a gesture including an operation of swiping the touch surface (second predetermined operation) and outputs a corresponding signal to the control unit 15.

For example, the control unit 15 is configured with a one-chip microcomputer, and controls by successively reading and executing a program recorded in internal ROM, to recognize the second predetermined operation as invalid when the second predetermined operation is detected by the second detection unit 14 within a predetermined time after the first predetermined operation is detected by the first detection unit 13. "First predetermined operation" here means an operation to push the push switch 11, "second predetermined operation" means a swiping operation, and "predetermined time" means a time that is preset in order to recognize as invalid the second predetermined operation detected after detection of the first predetermined operation.

The control unit 15 may also notify that the second predetermined operation is invalid. For example, as illustrated in FIG. 2(b), a notification unit has the light source 123 installed in each region of the upper region A, the lower region B, the left region C, and the right region D inside the touch surface (transparent electrode sheet 121), and, under control of the control unit 15, turns off the illumination of the light sources 123 corresponding to the regions other than the region in which the first predetermined operation was performed while the second predetermined operation is invalid. The color of the illumination of the light source may also be changed while the second predetermined operation is invalid.

The control unit 15 may also recognize the second predetermined operation as valid when a third predetermined operation is detected by the second detection unit 14 during a second predetermined time before detection of the first predetermined operation by the first detection unit 13. For example, "third predetermined operation" here means consecutive swipes or a strong swipe in which the stroke of the finger is long and fast, and "second predetermined time" means a reference time, to be described, that is necessary in order to determine whether there was a correction of direction when consecutive swipes or a strong swipe have/has been detected.

A main control unit 20 controls the input device 10, a memory unit 30, and the display unit 40, which are connected in common by a system bus 50 having installed a plurality of lines for addresses, data, and control, in order to execute application programs stored in the memory unit 30. "Application programs" mentioned here include a navigation application program for providing destination search and directions and guidance, as well as a media player for playing music or movies, SNS, email, and the like. For example, these application programs are selected in accordance with the direction of swiping using the input device 10.

For example, the memory unit 30 is implemented using SRAM (Static RAM), DRAM (Dynamic RAM), flash RAM, or other semiconductor memory elements, and these memory elements are divided into program regions for storing an OS (Operating System) or application programs executed by the main control unit 20, as well as working areas for storing various kinds of data generated in the process of execution of the application programs. The display unit 40 is a display monitor using as a display device LCD (Liquid Crystal Display), OLED (Organic Light Emitted Diode), electronic paper, or the like, and displays, for example, the display data illustrated in FIG. 5, which are generated by the applications executed by the main control unit 20.

(Operation of the Embodiment)

The operation of the input device 10 of the present embodiment illustrated in FIGS. 1 and 2 is described in detail below by reference to FIGS. 3 to 6B.

The basic operation of the input device 10 is first described by reference to the flowchart in FIG. 3. When the first detection unit 13 detects pushing down of the push switch 11 ("YES" in step S101), the control unit 15 starts an internal timer (step S102), and detects whether there is a swipe (step S103). Here, when a swipe is detected by the second detection unit 14 within the reference time counted by the timer ("YES" in step S103), the control unit 15 recognizes the detection of the swipe as invalid (step S104). "Swipe" mentioned here includes an ordinary swipe, as well as a strong swipe in which the stroke of the finger movement is comparatively long and fast.

The control unit 15 next controls the light sources 123 installed in the touch sensor 12, and controls to turn off the illumination in the regions of the touch sensor 12 other than the recognition region corresponding to the installation position of the pushed-down push switch 11, or to change the color of the illumination in all regions, while input using the touch sensor 12 is invalid (step S105).

The above processing is iteratively executed until the internal timer times out, and when time-out of the internal timer is detected ("YES" in step S106), the control unit 15 allows reception of swipes following the one that was previously recognized as invalid (step S107). That is, the control unit 15 controls to invalidate input using the touch sensor 12 for a predetermined time until time-out of the internal timer is detected after pushing down of the push switch 11 is detected. This is a measure against misrecognizing as a gesture an action in which a finger slides on the touch surface while the push switch 11 is pushed down. Gestures during operation of the push switch 11 can accordingly be separated.

While input using the touch sensor 12 is invalid, the control unit 15 also controls to turn off the illumination other than that in the pushed-down push switch 11, or to change the color, in order to give notification of this state to the driver. That is, the input device 10 of the present embodiment has the light source 123 installed in each region of the upper region A, the lower region B, the left region C, and the right region D inside the touch surface of the touch sensor 12, and turns off the illumination of the light sources 123 corresponding to the regions other than the region in which the first predetermined operation (pushing down of the push switch 11) was performed while the second predetermined operation (swipe) is invalid. The driver accordingly can confirm that an action of a finger riding on the switch surface is not misrecognized even if that action occurs while the push switch 11 is pushed down.

Figure 3:
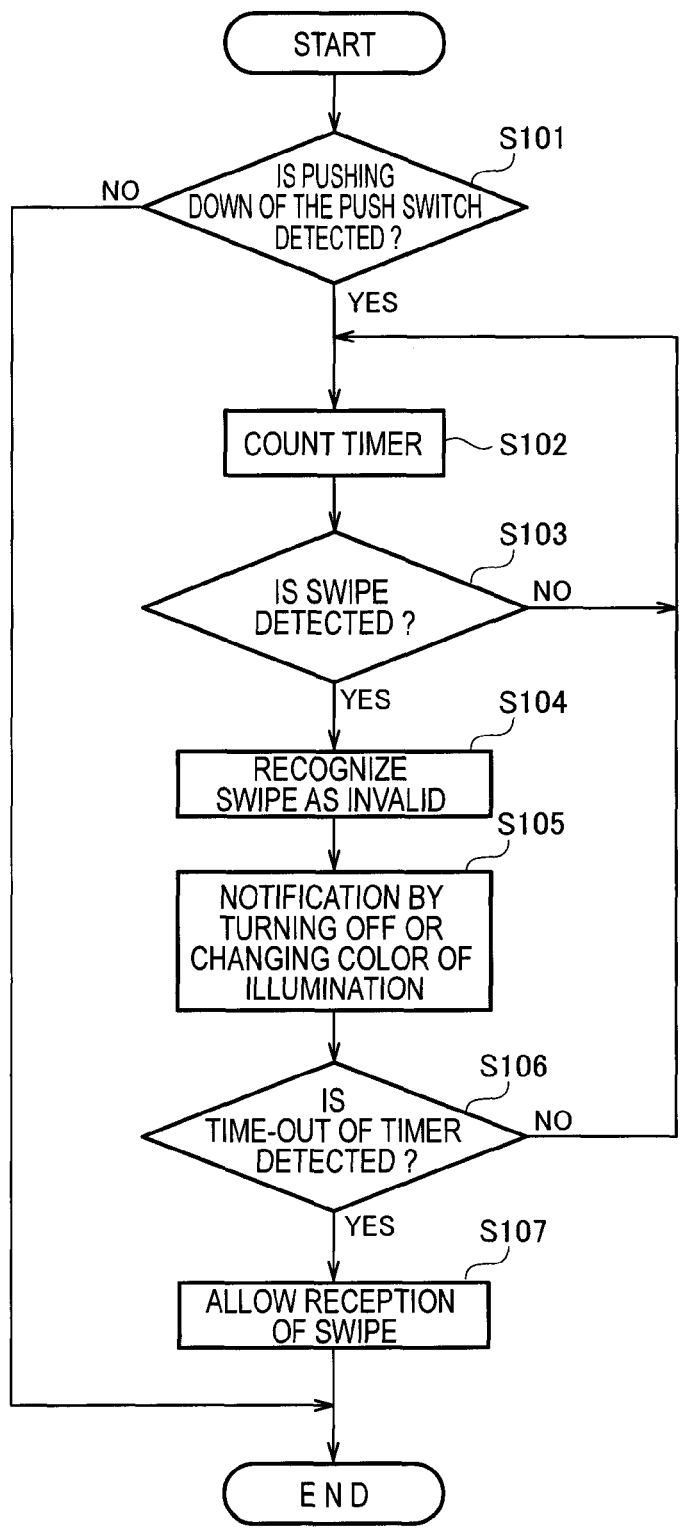
FIG. 3 is a flowchart of a basic operation of the input device of the embodiment of the present invention.
Figure 4:
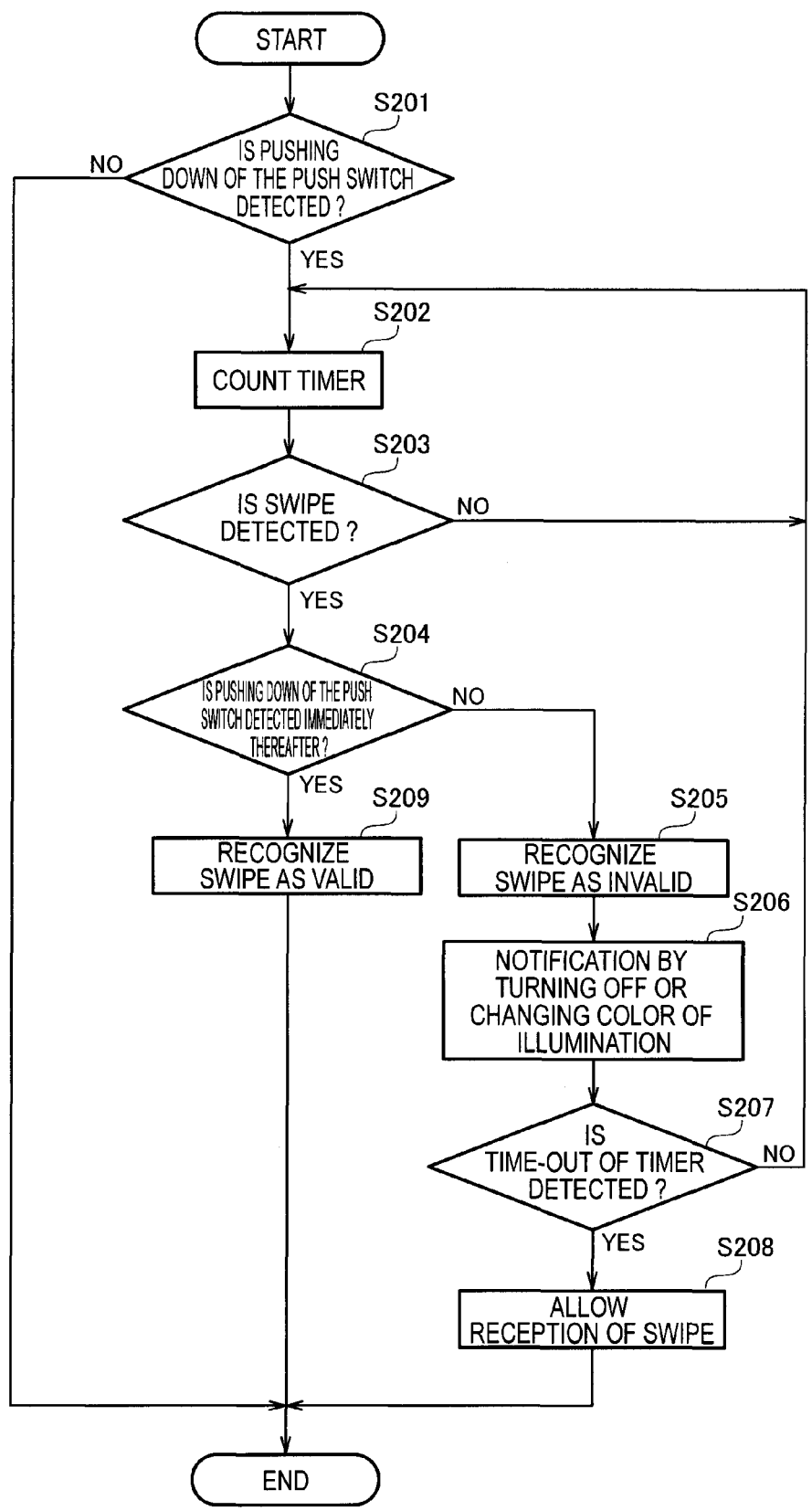
FIG. 4 is a flowchart of an applied operation of the input device of the embodiment of the present invention.

FIG. 4 illustrates an applied operation of the input device 10 of the present embodiment. In FIG. 4, the operation from the push switch 11 being pushed down to detection of a swipe 12 is the same as in the basic operation illustrated in FIGS. 3 (S201 to S203). When pushing down of the push switch 11 is detected immediately after the swipe is detected in step S204 ("YES" in step S204), the control unit 15 controls to validate the immediately preceding swipe operation (step S209). That is, the control unit 15 controls to validate the second predetermined operation (swipe) when a third predetermined operation (consecutive swipes or strong swipe) is detected by the second detection unit 14 within a second predetermined time before detection of the first predetermined operation (pushing down of the push switch 11) by the first detection unit 13. This is a measure to consider an ambiguous swipe crossing a boundary line between recognition regions as the same as a preceding swipe when swipes are input consecutively within a short time, whereby there can be prevented generation of output differing from the driver's intention due to slipping of the finger during consecutive operations.

When pushing down of the push switch 11 is not detected immediately after the swipe is detected in step S204 ("NO" in step S204), just as in the basic operation illustrated in FIG. 3, the control unit 15 recognizes the preceding swipe as invalid (step S205), and while input using the touch sensor 12 is invalid, controls to turn off the illumination of the regions of the touch sensor 12 other than the region corresponding to the installation position of the pushed-down push switch 11, or to change the color of the illumination of all regions (step S206). This processing is iteratively executed until the internal timer times out, and when time-out of the internal timer is detected ("YES" in step S207), the control unit 15 allows reception of swipes following the one that was previously recognized as invalid (step S208).

The operation of the input device 10 of the present invention, for example, when used as a remote control for the car navigation device 4 that executes a media player (here, music playback), is next described in detail by reference to the flowchart in FIG. 5 as well as FIGS. 6A to 8.

A music playback screen is displayed under control of the main control unit 20 on the display unit 40 of the car navigation device 4 (step S301). When pushing down of the push switch 11 is detected by the input device 10 (control unit 15) in this state ("YES" in step S302) and when the object is the enter key ("YES" in step S303), that fact is transferred to the main control unit 20 of the car navigation device 4. Upon receipt thereof, for example, the main control unit 20 displays the music list illustrated in FIG. 5(a) in place of the music playback screen (step S309).

When the object is not the enter key ("NO" in step S303) and when the object of the input information transferred from the input device 10 (control unit 15) is the up/down keys ("YES" in step S304), the main control unit 20 displays the music list displayed on the display unit 40, scrolling one line at a time vertically in accordance with the instructed direction (step S308). When the object is not the up/down keys ("NO" in step S304) but is the left/right keys ("YES" in step S305), a tab is scrolled horizontally (step S307). For example, when the object is a back key instructed by a long push of the left/right keys ("YES" in step S306), the main control unit 20 controls the display unit 40 to transition from the music list screen to the original music playback screen (step S301).

Meanwhile, in step S202, when the object is not pushing down of the push switch 11 ("NO" in step S203) and an input to the touch sensor 12 is detected ("YES" in step S310), the control unit 15 determines whether there is a further swipe (step S311). Here, when a swipe ↑ (FIG. 6A) is detected ("YES" in step S311), it is further determined as to whether there are consecutive swipes ↑↑ (FIG. 6B) or whether there is a strong swipe ↑+ (FIG. 6B) (step S312). "Consecutive swipes" means a succession of swipes in a short time, and "strong swipe" means a swipe in which the finger movement is long and fast. Here, when the detected operation is not consecutive swipes ("NO" in step S312), the display is performed following a display mode of display mode 1, and, for example, as illustrated in FIG. 6A, the screen of the display unit 40 undergoes page feeding, being updated to new music lists in the amount of three pieces (step S313). When the detected operation is a strong swipe or consecutive swipes by a succession of swipes, or the like ("YES" in step S312), for example, the display is performed following a display mode of display mode 2 illustrated in FIG. 6B.

In FIG. 6B, when the input device 10 (control unit 15) detects a strong swipe ↑+ or a succession of swipes ↑↑ when the music list is displayed on the display unit 40, the main control unit 20 displays on the display unit 40 a page by initial character search of the music list following display mode 2; specifically, music lists that are different from the music list displayed up to now and a list for each initial character such as "TA" or "NA." In the main control unit 20, when an ordinary swipe ↑ is again detected by the input device 10 (control unit 15) after displaying a page by initial character search in display mode 2 on the display unit 40, a change of the initial character to search is executed. That is, once the display mode changes, the initial character serving as the target of search can be changed with just an ordinary swipe.

Incidentally, because the driver cannot see the screen of the display unit 40 and cannot confirm even the direction of a swipe of the finger during operation of the vehicle 1, the input device 10 (control unit 15) must recognize consecutive operations in the same direction as intentional when swipes are consecutively detected during a short period of time. Therefore, the input device 10 (control unit 15) must determine whether a swipe detected within a predetermined time after a swipe was once detected is in the same direction as the previously detected swipe. "Processing of correction of direction" therefore must be performed in the input device 10 of the present embodiment.

Figure 7:
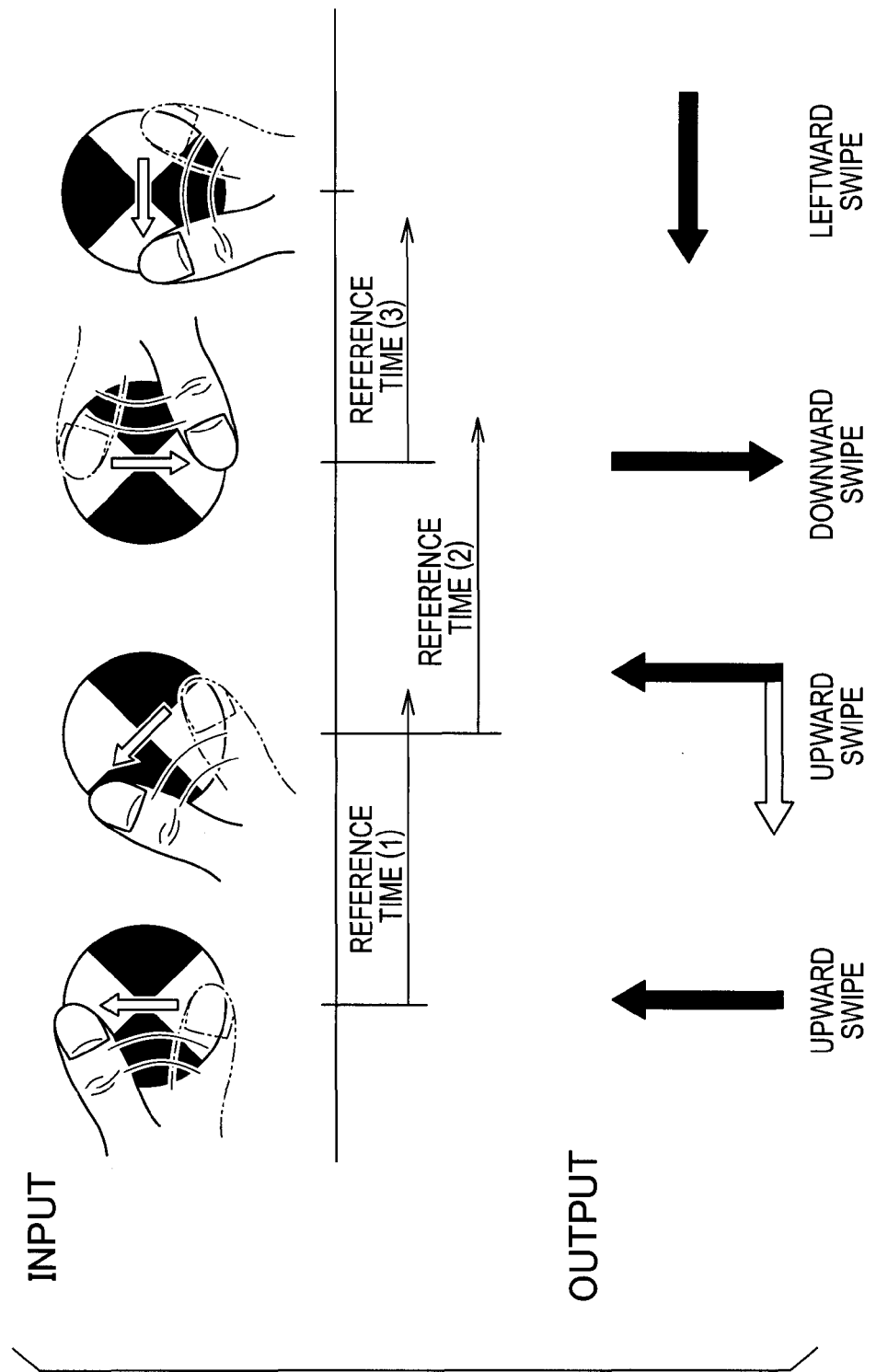
FIG. 7 is a view illustrating an example of processing of correction of direction in FIG. 4.

FIG. 7 presents an outline of processing of correction of direction, in which a reference time is fixed and a direction is corrected. In FIG. 7, the driver, being the operator, makes an upward swipe going from the lower region B to the upper region A on the touch surface of the touch sensor 12. Next, during a predetermined time, the driver next makes a leftward swipe touching the boundary with the direction previously swiped or makes an ambiguous swipe tracing the boundary line of the recognition region. At this time, because the elapsed time from the preceding swipe is within the reference time (1), the control unit 15 considers these to be consecutive swipes in the same direction rather than determining that the driver has performed a rightward swipe.

The input device 10 (control unit 15) next detects a downward swipe going from the upper region A to the lower region B on the touch sensor 12 after elapse of a predetermined time. In this case, although the time elapsed time since the preceding input is within the reference time (2), the control unit 15 does not recognize these as consecutive operations, because the swipe is in the reverse direction. After elapse of a predetermined time, the driver next makes a leftward swipe from the right region D to the left region C on the touch surface of the touch sensor 12. In this case, the control unit 15 recognizes this as a leftward swipe rather than consecutive operations, because the elapsed time from that of the preceding input is not within the reference time (3). Incidentally, the main control unit 20 now performs processing to switch applications to be executed in accordance with input information transferred by the input device 10 (control unit 15).

Incidentally, the time of successive swipes (interval of consecutive operations) on the touch sensor 12 differs in accordance with the driver. Therefore, in the input device 10 of the present embodiment, the control unit 15 sets an optimal reference time for each driver through learning. FIG. 8 illustrates the concept of learning processing, in which the reference time is made variable on the basis of an operating interval of a driver, being the operator. As illustrated in FIG. 8, the control unit 15 can (a) measure an interval of consecutive operations of swipes by the driver, and (b) set a reference time obtained by adding a constant to the time obtained by measurement or multiplying the time by the constant. That is, the control unit 15 can set an optimal reference time for each driver by adjusting a predetermined time (reference time) on the basis of a difference between a first time when the first predetermined operation (swipe) was detected and a second time of a swipe detected next.

Figure 5:
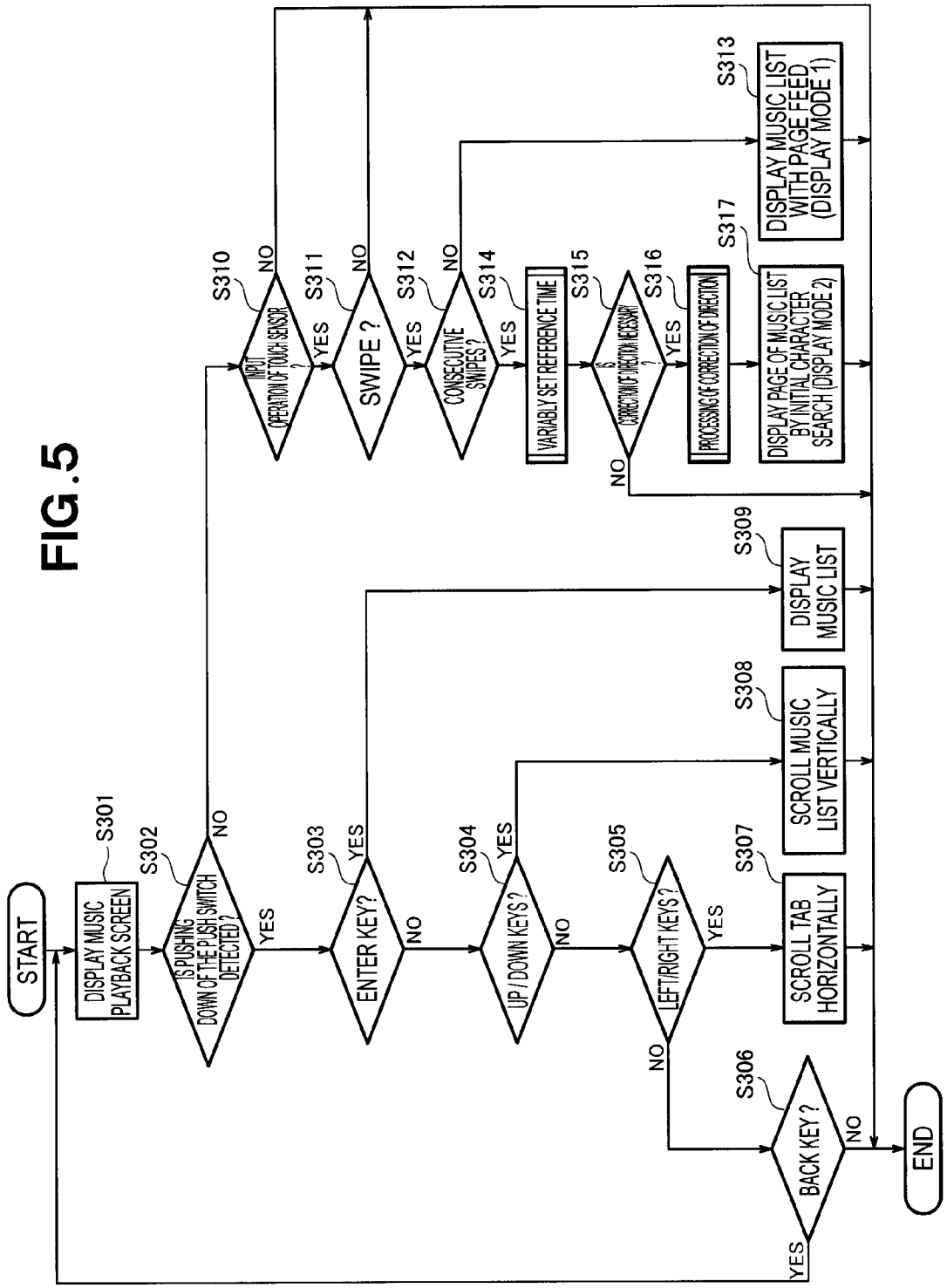
FIG. 5 is a flowchart of the operation when the input device of the embodiment of the present invention is applied to a media player.

The description returns to the flowchart in FIG. 5. When consecutive swipes are detected in step S212 ("YES" in step S312), the input device 10 (control unit 15) uses a reference time set by learning (step S314) and determines whether there is a correction of direction (step S315). When it is determined that correction of direction is necessary ("YES" in step S315), the correction of direction depicted in FIG. 7 (recognition as consecutive swipes in the same direction because the elapsed time from the preceding swipe is within the reference time) is carried out, and the corrected direction is transferred as input information to the main control unit 20) (step S316). Upon receipt thereof, the main control unit 20 executes display mode 2 to generate and display on the display device 40 a music list by initial character search (step S317).

When correction of direction is not necessary ("NO" in step S315); that is, when a swipe in the reverse direction to the previously input swipe is detected, the swipe in the reverse direction is recognized as valid, and that input information is transferred to the main control unit 20. Upon receipt thereof, the main control unit 20 does not execute display mode 2 but executes a defined function corresponding to the recognized swipe. That is, the control unit 15 recognizes the swipe corresponding to the second predetermined operation as valid when the direction of the swipe corresponding to the first swipe operation and the direction corresponding to the second predetermined operation are opposite.

(Effects of the Embodiment)

In the input device 10 of the present embodiment as described above, functions allocated to the push switch 11 and each gesture on the touch sensor 12 can be executed by installing the touch sensor 12 on the push switch 11, thereby enabling provision of an input device 10 having favorable usability corresponding to the application. For example, because the push switch 11 comprises a plurality of switches corresponding to an enter key and four direction keys for up, down, left, and right and the touch sensor 12 is installed on the plurality of switches, there can be avoided erroneous recognition as a swipe, for example, when the switch corresponding to the up key is first pushed down and the switch corresponding to the down key is next pushed down.

The control unit 15 also invalidates the second predetermined operation when the second predetermined operation is detected by the second detection unit 14 within a predetermined time (reference time (1)) after detection of the first predetermined operation by the first detection unit 13. Therefore, in operation of a touch sensor 12 enabling gesture operation in addition to operation of the push switch 11, the gesture operation can be separated during operation of the push switch 11 by invalidating operation of the touch sensor 12 during the predetermined time after operation of the push switch 12, and there can be avoided misrecognizing as a gesture an action of a finger sliding on the touch surface during operation of the push switch 11.

In the input device 10 of the present embodiment, notification by the notification unit that the second predetermined operation is invalid allows the operator to confirm by eye that the gesture operation on the touch sensor 12 is invalid. The notification unit here has light sources (LED) installed in each region among the upper region, the lower region, the left region, and the right region inside the touch surface, and turns off the illumination of the light sources corresponding to the regions other than the region in which the first predetermined operation was performed while the second predetermined operation is invalid, or changes the color of the illumination of the light sources while the second predetermined operation is invalid.

In the input device 10 of the present embodiment, the control unit 15 controls to validate the second predetermined operation (swipe) when a third predetermined operation (consecutive swipes or a strong swipe) is detected by the second detection unit 14 during a second predetermined time before detection, by the first detection unit 13, of the first predetermined operation (pushing down of the push switch 11). This is a measure to consider an ambiguous swipe crossing a boundary line between recognition regions as the same as a preceding swipe when swipes are input consecutively within a short time, and generation of output differing from the driver's intention due to slipping of the finger during consecutive operations can be prevented thereby.

A particularly remarkable effect is obtained when the input device 10 of the present embodiment is used as a remote control for a car navigation device 4. For example, as illustrated in FIG. 1, a remarkable effect is obtained when the input device is disposed on a spoke unit 3 that is operable by a driver's thumb when the driver grips a steering wheel 2. That is, the input device 10 of the present embodiment enables direct sensory operation by the operator while suppressing movement of the line of sight, and an input device 10 having favorable usability can be provided not only by gesture operations on the touch panel 12, but also by utilizing the push switch integrated with the touch sensor 12.

(Modifications)

The input device 10 of the present embodiment is described as one in which the control unit 15 is configured with a one-chip microcomputer and is installed inside the input device 10, and input information is transferred by interprocess communication over wire with the main control unit 20 of the car navigation device 4, but the input information may be transferred by wireless rather than by wire. In this case, more compact installation becomes possible, because a harness for connection with the car navigation device 4 is not required. Also, for example, functions of the control unit 15 of the input device 10 can be substituted by the main control unit 20 of the car navigation device 4, and in this case, the input device 10 can be produced inexpensively.

In the input device 10 of the present embodiment, the notification unit is described as an LED or other light source installed inside the touch sensor 12, but notification is also possible by sound output from a speaker in the car navigation device 4. A particularly remarkable effect is obtained when the input device 10 of the present embodiment is used as a remote control for a car navigation device 4. For example, as illustrated in FIG. 1, a remarkable effect is obtained when the input device is disposed on a spoke unit 3 that is operable by a driver's thumb when the driver grips a steering wheel 2. That is, the input device 10 of the present embodiment enables direct sensory operation by the operator while suppressing movement of the line of sight, and an input device 10 having favorable usability can be provided not only by gesture operations on the touch panel 12, but also by utilizing the push switch integrated with the touch sensor 12.

The input device 10 of the present embodiment is described as being applicable as a remote control for a car navigation device 4 on board a vehicle 1, but the input device is also applicable to a meter. The input device also is not limited to vehicles, and is also applicable as an input device 10 of a portable information device including a PC (Personal Computer). In this case, the gestures including swiping of the touch sensor 12 are not limited to the thumb and may be operated by other fingers.

Obviously, various minor changes and modifications of the present invention are possible in light of the above teaching. It is therefore to be understood that within the scope of the appended claims the invention may be practiced otherwise than as specifically described.

What is claimed is:

1. An input device, comprising:
a push switch;
a touch sensor installed on the push switch;
a first detection unit for detecting pushing down by a user of the push switch;
a second detection unit for detecting a swipe by the user on the touch sensor; and
a control unit for recognizing the pushing down of the push switch detected by the first detection unit and the swipe on the touch sensor detected by the second detection unit,
wherein the control unit recognizes the swipe on the touch sensor as invalid when swipe is detected by the second detection unit within a first predetermined time after pushing down of the push switch is detected by the first detection unit;
wherein the control unit recognizes the swipe on the touch sensor detected by the second detection unit within the first predetermined time as valid when another swipe on the touch sensor is detected by the second detection unit within a second predetermined time before detection of the pushing down of the push switch by the first detection unit.

2. The input device of claim 1, wherein a plurality of the push switches is provided, and the touch sensor is installed on the plurality of push switches.

3. The input device of claim 1, further comprising a notification unit for notifying that the swipe on the touch sensor detected by the second detection unit is invalid.

4. The input device of claim 3, wherein the notification unit has a light source installed in each region among the upper region, the lower region, the left region, and the right region inside touch surface, and turns off illumination of the light sources corresponding to the regions other than the region in which the pushing down of the push switch was performed while the swipe on the touch sensor is invalid.

5. The input device of claim 3, wherein the notification unit has a light source installed inside a touch surface, and changes a color of illumination of the light source while the swipe on the touch sensor is invalid.

6. The input device of claim 1, wherein:
the touch sensor has a touch surface divided into four regions, upper, lower, left, and right, and the control unit recognizes any of a swipe in a first direction going from the lower region to the upper region, a swipe in a second direction going from the upper region to the lower region, a swipe in a third direction going from the left region to the right region, and a swipe in a fourth direction going from the right region to the left region.

7. The input device of claim 1, for use in a vehicle having a steering wheel including a spoke unit, wherein the input device is disposed on a the spoke unit of the steering wheel and operable by a driver's thumb while the driver grips the steering wheel.

* * * * *